(12) United States Patent
Chiang

(10) Patent No.: US 10,193,371 B2
(45) Date of Patent: Jan. 29, 2019

(54) CHARGING/DISCHARGING APPARATUS USING THERMOELECTRIC CONVERSION EFFECT

(71) Applicants: Inventec (Pudong) Technology Corporation, Shanghai (CN); INVENTEC CORPORATION, Taipei (TW)

(72) Inventor: Meng-Lung Chiang, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 360 days.

(21) Appl. No.: 15/145,786

(22) Filed: May 3, 2016

(65) Prior Publication Data

US 2017/0155267 A1    Jun. 1, 2017

(30) Foreign Application Priority Data

Nov. 27, 2015   (CN) .......................... 2015 1 0846692

(51) Int. Cl.
| | |
|---|---|
| *H02J 7/00* | (2006.01) |
| *H01L 35/10* | (2006.01) |
| *H01L 35/16* | (2006.01) |
| *H01L 35/18* | (2006.01) |

(52) U.S. Cl.
CPC ............ *H02J 7/0091* (2013.01); *H01L 35/10* (2013.01); *H01L 35/16* (2013.01); *H01L 35/18* (2013.01); *H02J 7/0042* (2013.01)

(58) Field of Classification Search
CPC .......... H01L 35/10; H01L 35/16; H01L 35/18
USPC .......................................................... 320/101
See application file for complete search history.

(56) References Cited

U.S. PATENT DOCUMENTS

| | | | |
|---|---|---|---|
| 6,232,543 B1* | 5/2001 | Nagata | G04C 10/00 136/203 |
| 2003/0209014 A1* | 11/2003 | Chang | F25B 21/04 62/3.3 |

* cited by examiner

*Primary Examiner* — David V Henze-Gongola
(74) *Attorney, Agent, or Firm* — CKC & Partners Co., Ltd.

(57) ABSTRACT

A charging/discharging apparatus utilizing the thermoelectric conversion effect includes a thermoelectric conversion module, a current path providing unit and a charging/discharging element. The thermoelectric conversion module is disposed between an upper cover and a lower cover of a wearable device. The thermoelectric conversion module generates a current according to a temperature difference between the upper cover and the lower cover. The current path providing unit coupling with the thermoelectric conversion module provides a first current path and a second current path. The charging/discharging element couples with the current path providing unit. When a temperature of the lower cover is higher than a temperature of the upper cover, the current charges the charging/discharging element through the first current path. When a temperature of the upper cover is higher than a temperature of the lower cover, the current charges the charging/discharging element through the second current path.

7 Claims, 5 Drawing Sheets

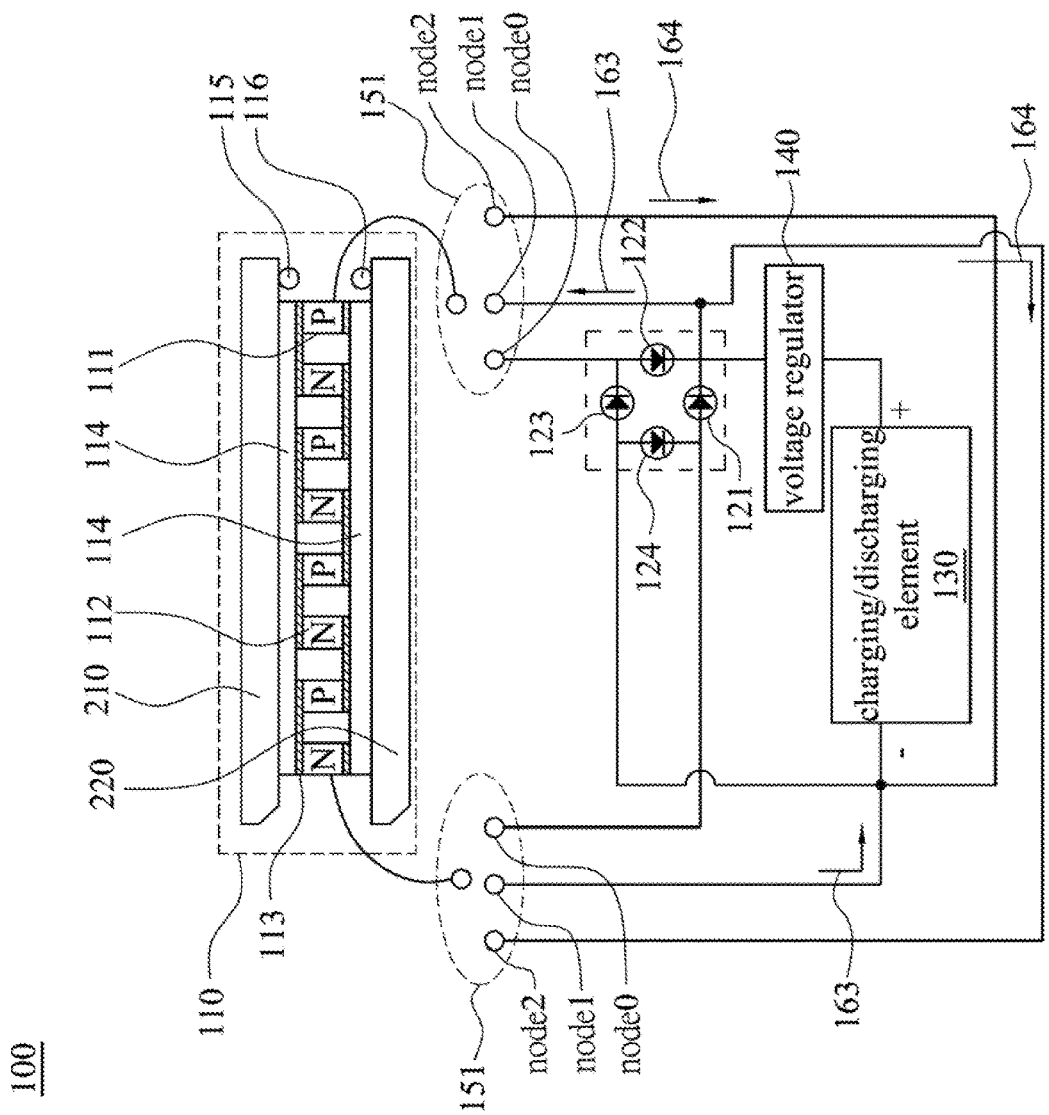

CHARGING/DISCHARGING APPARATUS USING THERMOELECTRIC CONVERSION EFFECT

RELATED APPLICATIONS

This application claims priority to Chinese Application Serial Number 201510846692.6, filed Nov. 27, 2015, which is herein incorporated by reference.

BACKGROUND

Field of Invention

The invention relates to a charging/discharging apparatus, and particularly relates to a charging/discharging apparatus using thermoelectric conversion effect.

Description of Related Art

Typically, the wearable device uses an external connector, such as a micro-USB, to connect an external power supply for charging through a cable. However, if the wearable device is made waterproof and dustproof, the external connector for the wearable devices requires an additional waterproof and dustproof design, which will increase the design difficulty and manufacturing cost. Moreover, it is inconvenient for users to carry a cable to connect the external power supply for charging the device. Therefore, various charging methods without using the external connector are developed, such as a magnetic induction charging method a magnetic resonance charging method, a solar energy charging method, and a mechanical energy charging method. However, the magnetic induction charging method and the magnetic resonance charging method must comply with a corresponding charging plate during charging. The solar energy charging method and the mechanical energy charging method depend on the operation environment, such as whether the environment has sufficient light source.

As a result, how to provide a solution to effectively solve the aforementioned inconvenience shall be seriously concerned. A charging/discharging apparatus may solve the aforementioned problems is still needed.

SUMMARY

The present invention provides a charging/discharging apparatus utilizing the thermoelectric conversion effect comprises a thermoelectric conversion module, a current path providing unit and a charging/discharging element. The thermoelectric conversion module is disposed between an upper cover and a lower cover of a wearable device. The thermoelectric conversion module generates a current according to a temperature difference between the upper cover and the lower cover. The current path providing unit coupling with the thermoelectric conversion module provides a first current path and a second current path. The charging/discharging element couples with the current path providing unit. When a temperature of the lower cover is higher than a temperature of the upper cover, the current charges the charging/discharging element through the first current path. When a temperature of the upper cover is higher than a temperature of the lower cover, the current charges the charging/discharging element through the second current path.

In an embodiment, the charging/discharging apparatus further comprises a third current path. The charging/discharging element provides a first current to the thermoelectric conversion module through the third current path to heat up a temperature of the upper cover and cool down a temperature of the lowercover. The first current flows through the thermoelectric conversion module according to a first direction.

In an embodiment, the charging/discharging apparatus further comprises a fourth current path. The charging/discharging element provides a second current to the thermoelectric conversion module through the fourth current path to heat up a temperature of the lower cover and cool down a temperature of the upper cover. The second current flows through the thermoelectric conversion module according to a second direction. The first direction is opposite to the second direction.

In an embodiment, the charging/discharging apparatus further comprises a switch disposed among the thermoelectric conversion module, the third current path, the fourth current path and the current path providing unit. The switch selects one of the third current path, the fourth current path and the current path providing unit to couple with the thermoelectric conversion module.

In an embodiment, the charging/discharging apparatus further comprises a voltage regulator disposed among the charging/discharging element, the third current path, the fourth current path and the current path providing unit.

In an embodiment, the charging/discharging apparatus further comprises a pulse wave generator disposed among the charging/discharging element, the third current path, the fourth current path and the current path providing unit. The pulse wave generator transforms a current from the thermoelectric conversion module into a pulse current to charge the charging/discharging element through the current path providing unit, or to transform a current from the charging/discharging element into a pulse current to heat up or cool down the temperature of the upper cover and the lower cover through the third current path and the fourth current path.

In an embodiment, the thermoelectric conversion module comprises a plurality of P-type thermal-electric material and a plurality of N-type thermal-electric material coupled in series in a P-N pair formed.

In an embodiment, the P-type thermal-electric material and the N-type thermal-electric material are formed by bismuth tellurium compounds or tellurium compounds.

In an embodiment, the charging/discharging apparatus further comprises a first temperature sensor and a second temperature sensor disposed on the upper cover and the lower cover respectively. The first temperature sensor and the second temperature sensor detect a temperature of the upper cover and a temperature of the lower cover respectively.

In an embodiment, the charging/discharging apparatus further comprises a first insulating material to divide the upper cover into a first upper cover portion and a second upper cover portion, and a second insulating material to divide the lower over into a first lower cover portion and a second portion. The thermoelectric conversion module is disposed between the first upper cover portion and the first lower cover portion, and a third temperature sensor and a fourth temperature sensor are disposed on the second upper cover portion and the second lower cover portion respectively.

Accordingly, in conjunction with a current path providing unit to provide different charging current paths, the thermoelectric conversion module of the charging/discharging apparatus may charge the charging and discharging element whether the user's body temperature is higher than the ambient air temperature or not. Therefore, the present invention may reach the purpose of making full use of the temperature difference.

Because the described procedure identifies differentially expressed genes separately from each data set, its application is not limited by platform differences and its effectiveness is not affected by batch effects.

It is to be understood that both the foregoing general description and the following detailed description are by examples, and are intended to provide further explanation of the invention as claimed.

BRIEF DESCRIPTION OF THE DRAWINGS

The invention can be more fully understood by reading the embodiment described below, with reference made to the following drawings:

FIG. 3 illustrates a schematic diagram of a charging and discharging apparatus according to another preferred embodiment of the present invention.

DETAILED DESCRIPTION

Figure 1:
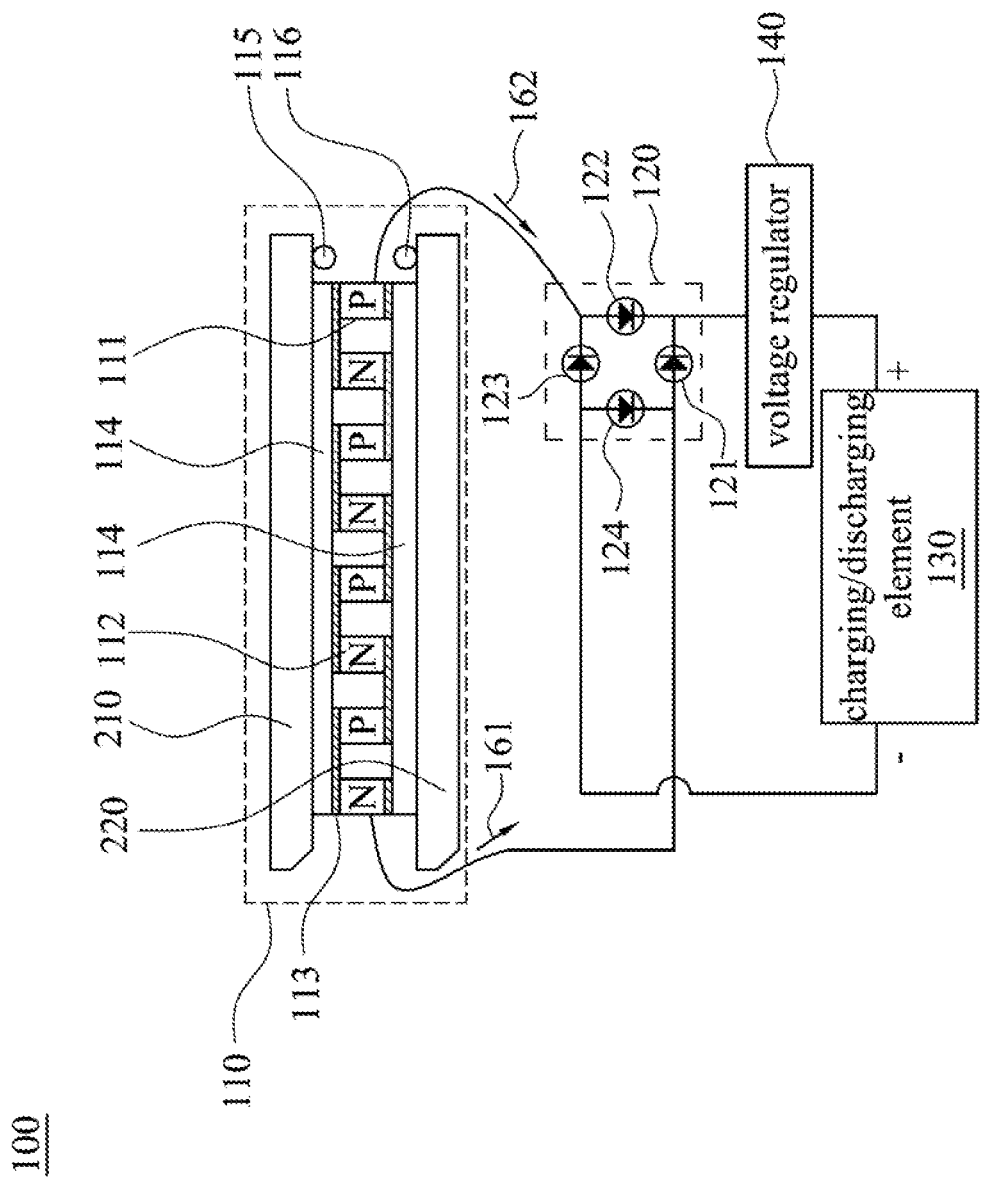
FIG. 1 illustrates a schematic diagram of a charging and discharging apparatus according to a preferred embodiment of the present invention.

Reference will now be made in detail to the present embodiment of the invention, workflow of which is illustrated in the accompanying drawings. The same reference numbers are used in the drawings and in the description to refer to the same parts.

The thermoelectric conversion module of the charging and discharging apparatus of the present invention uses the temperature difference between the body surface of a user and the external environment to perform the thermoelectric conversion process to charge a charging and discharging element within the wearable device. In conjunction with a current path providing unit to provide different charging current paths, the thermoelectric conversion module may charge the charging and discharging element whether the user's body temperature is higher than the ambient air temperature or not. Therefore, the present invention may reach the purpose of making full use of the temperature difference between the body surface of a user and the external environment. Since the present invention utilizes thermoelectric conversion method for charging, it is not necessary for the wearable device to dispose an additional external connector, which may greatly reduce the design difficulty and manufacturing costs.

Figure 2B:
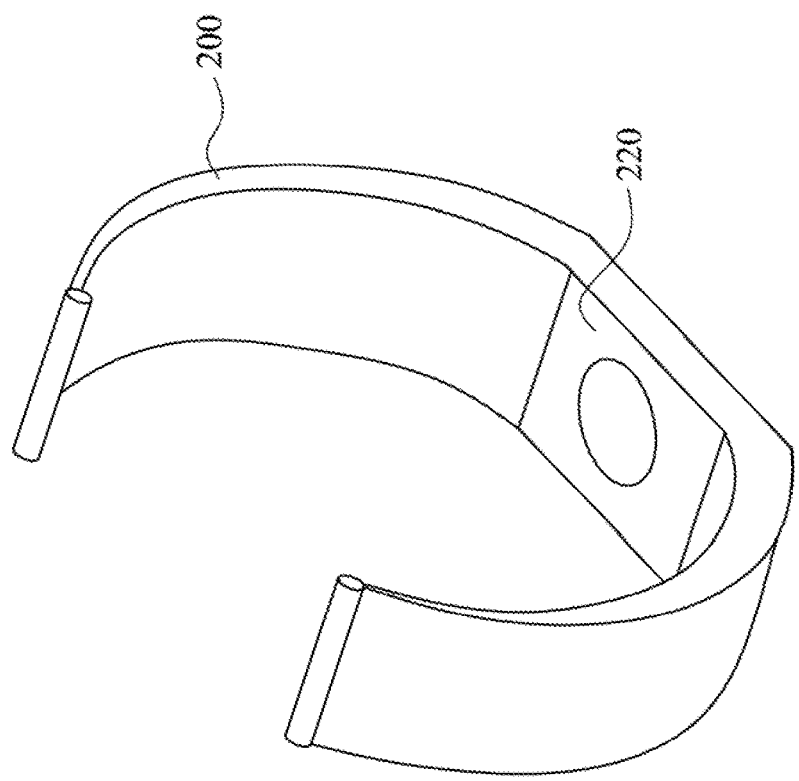
FIG. 2A and FIG. 2B illustrates a schematic diagram of a wearable device which can use the charging and discharging apparatus of the present invention for charging and adjust the temperature.
Figure 2A:
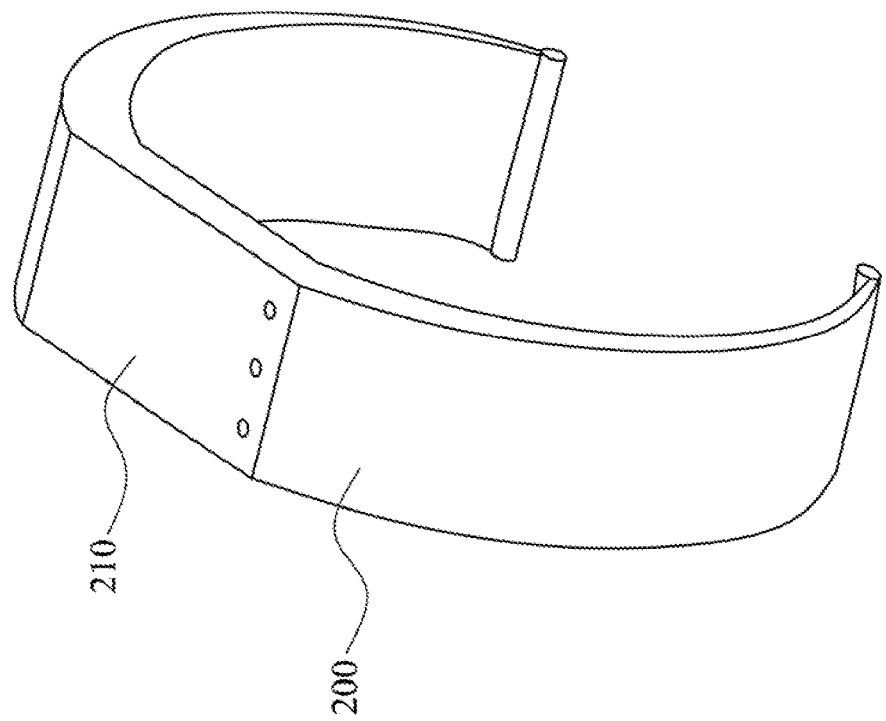

FIG. 1 illustrates a schematic diagram of a charging and discharging apparatus according to a preferred embodiment of the present invention. FIG. 2A and FIG. 2B illustrates a schematic diagram of a wearable device which can use the charging and discharging apparatus of the present invention for charging and adjust the temperature. The charging and discharging apparatus 100 of the present invention includes a thermoelectric conversion module 110, a current path providing unit 120, and a charging/discharging element 130. The charging/discharging element 130 is a battery or a capacitor that may be charged and discharged repeated.

The thermoelectric conversion module 110 may perform an energy transforming between the electrical energy and thermal energy. In an embodiment, the thermoelectric conversion module 110 may be disposed between the upper cover 210 and the lower cover 220 of the wearable device 200 as illustrated in FIG. 2A and FIG. 2B. The lower cover 220 closes to the skin for detecting a user's body temperature, and the upper cover 210 closes to the air for detecting the ambient air temperature. The thermoelectric conversion module 110 uses the temperature difference between the user's body temperature and the ambient air temperature to perform the energy transforming between the thermal energy and the electric energy. The thermoelectric conversion module 110 includes a plurality of P-type thermal-electric material 111 and a plurality of N-type thermal-electric material 112 coupled in series in a P-N pair formed. In one embodiment, the P-type thermal-electric material 111 and the N-type thermal-electric material 112 may be formed by bismuth tellurium compounds or tellurium compounds. One end of the P-type thermal-electric material 111 and one end of the N-type thermal-electric material 112 in a PN pair are connected together through a conductive plate 113. The other end of the P-type thermal-electric material 111 and the other end of the N-type thermal-electric material 112 in a PN pair are connected to other two adjacent PN pairs through two conductive plates 113 respectively to form a series connection structure. The conductive plate 113 is used to perform electrical and thermal conduction. In one embodiment, a copper material with good electrical and thermal conduction is selected to form the conductive plate 113. An electrically insulating thermal coupling layer 114 is further formed between the conductive plate 113 and the upper cover 210, and the conductive plate 113 and the lower cover 220. In one embodiment, a material with good electrical insulation as well as heat transferring property, such as beryllium oxide ceramics, may be used to form the thermal coupling layer 114. In addition, a first temperature sensor 115 and a second temperature sensor 116 are respectively disposed on the sides of the P-type thermal-electric material 111 in the upper cover 210 and the lower cover 220 for sensing ambient air temperature and the user's body temperature.

When the heat energy is transformed into the electrical energy, for example, in the case of the temperature difference existing, the majority carriers (holes) in the P-type thermal-electric material 111 located in the hot region have a greater chance to move from the hot region to the cold region, which behaves like a current flows from the hot region to the cold region. Similarly, the majority carriers (electrons) in the N-type thermal-electric material 112 located in the hot region have a greater chance to move from the hot region to the cold region, which behaves like a current flows from the cold region to the hot region. Therefore, when the P-type thermal-electric material 111 and the N-type thermal-electric material 112 are connected by the conductive plate 113 in series, a current loop will be formed when a temperature difference existed. Accordingly, when the temperature of the lower cover 220 is higher than the temperature of the upper cover 210, since the current in the P-type thermal-electric material 111 flows from the hot side (the lower cover 220) to the cold side (the upper cover 210), and the current in the N-type thermal-electric material 112 flows from the cold side (the upper cover 210) to the hot side (the lower cover 220), the current will flow in accordance with the current path direction 161. In contrast, when the temperature of the upper cover 210 is higher than the temperature of the lower cover 220, since the current in the P-type thermal-electric material 111 flows from the hot side (the upper cover 210) to the cold side (the lower cover 220), and the current in the N-type thermal-electric material 112 flows from the cold side (the lower cover 220) to the hot side (the upper cover 210), the current will flow in accordance with the current path direction 162. Since, in use, the temperature of the upper cover 210 may be higher or lower than the temperature of the lower cover 220, the present invention further comprises a current path providing unit 120 to provide different current paths for the thermoelectric conversion module 110 to charge the charging/discharging element 130. For example, the current path providing unit 120 provides a first current path to the current following in accordance with the current path direction 161 to charge the charging/discharging element 130. On the other hand, the current path providing unit 120 provides a second current path to the current following in accordance with the current path direction 162 to charge the charging/discharging element 130. In one embodiment, the current path providing unit 120 is a bridge rectifier consisted of four diodes 121, 122, 123 and 124. Accordingly, when the thermoelectric conversion module 110 generates a current following in accordance with the current path direction 161, the current path providing unit 120 provides a first current path formed by the diodes 121 and 123 to this current to charge the charging/discharging element 130. At this time, the diodes 122 and 124 fare used to prevent current reflux. On the other hand, when the thermoelectric conversion module 110 generates a current following in accordance with the current path direction 162, the current path providing unit 120 provides a second current path formed by the diodes 122 and 123 to this current to charge the charging/discharging element 130 through. At this time, the diodes 121 and 124 fare used to prevent current reflux. Therefore, the thermoelectric conversion module 110 may charge the charging/discharging element 130 as long as there is a temperature difference between the upper cover 210 and the lower cover 220. In another embodiment, a voltage regulator 140 is further disposed in the charging path to adjust the voltage for charging the charging/discharging element 130 to achieve the purpose of stabilizing the charging process.

Moreover, since the thermoelectric conversion module 110 also can convert the electrical energy into thermal energy, the temperatures of the upper cover 210 and the lower cover 220 can be also controlled in the present invention by controlling the direction of the discharging current following from the charging/discharging element 130 to the thermoelectric conversion module 110. FIG. 3 illustrates a schematic diagram of a charging and discharging apparatus according to another preferred embodiment of the present invention. Comparing with the previous embodiment, two additional switches, a first switch 151 and a second switch 152, are disposed in this embodiment to select the thermoelectric conversion module 110 to charge the charging/discharging element 130 through the current path providing unit 120 or the charging/discharging element 130 to provide current to the thermoelectric conversion module 110 through a third current path 163 or a fourth current path 164 to control the temperatures of the upper cover 210 and the lower cover 220.

In one embodiment, when the charging/discharging element 130 provides a current to the thermoelectric conversion module 110, when the current passes through the P-type thermal-electric material 111 the moving direction of the majority carriers (holes) is same as the flowing direction of the current, and when the current passes through the N-type thermal-electric material 112, the moving direction of the majority carriers (electrodes) is opposite to the flowing direction of the current. Accordingly, when the first switch 151 and second switch 152 is controlled to couple with the node 0 as shown in FIG. 1, the thermoelectric conversion module 110 charges the charging/discharging element 130 through the current path providing unit 120. When the first switch 151 and second switch 152 is controlled to couple with the node 1, the charging/discharging element 130 provides a direct current to the thermoelectric conversion module 110 through the third current path 163. At this time, since the moving direction of the majority carriers (holes) is same as the flowing direction of the current in the P-type thermal-electric material 111, the carriers (holes) with energy are accumulated in the upper cover 210. On the other hand, since the moving direction of the majority carriers (electrodes) is opposite to the flowing direction of the current in the N-type thermal-electric material 112, the carriers (electrodes) with energy are accumulated in the upper cover 210, too. Because all carriers with energy are accumulated in the upper cover 210, the temperature of the upper cover 210 is increased. On the other hand, because all carriers with energy are far away from the lower cover 220, the temperature of the lower cover 220 is reduced. On the other hand, when the first switch 151 and the second switch 152 is controlled to couple with the node 2, the charging/discharging element 130 provides a direct current to the thermoelectric conversion module 110 through the fourth current path 164. At this time, since the moving direction of the majority carriers (holes) is same as the flowing direction of the current in the P-type thermal-electric material 111, the carriers (holes) with energy are accumulated in the lower cover 220. On the other hand, since the moving direction of the majority carriers (electrodes) is opposite to the flowing direction of the current in the N-type thermal-electric material 112, the carriers (electrodes) with energy are accumulated in the lower cover 220, too. Because all carriers with energy are accumulated in the lower cover 220, the temperature of the lower cover 220 is increased. On the other hand, because all carriers with energy are far away from the upper cover 210, the temperature of the upper cover 210 is reduced.

Figure 4:
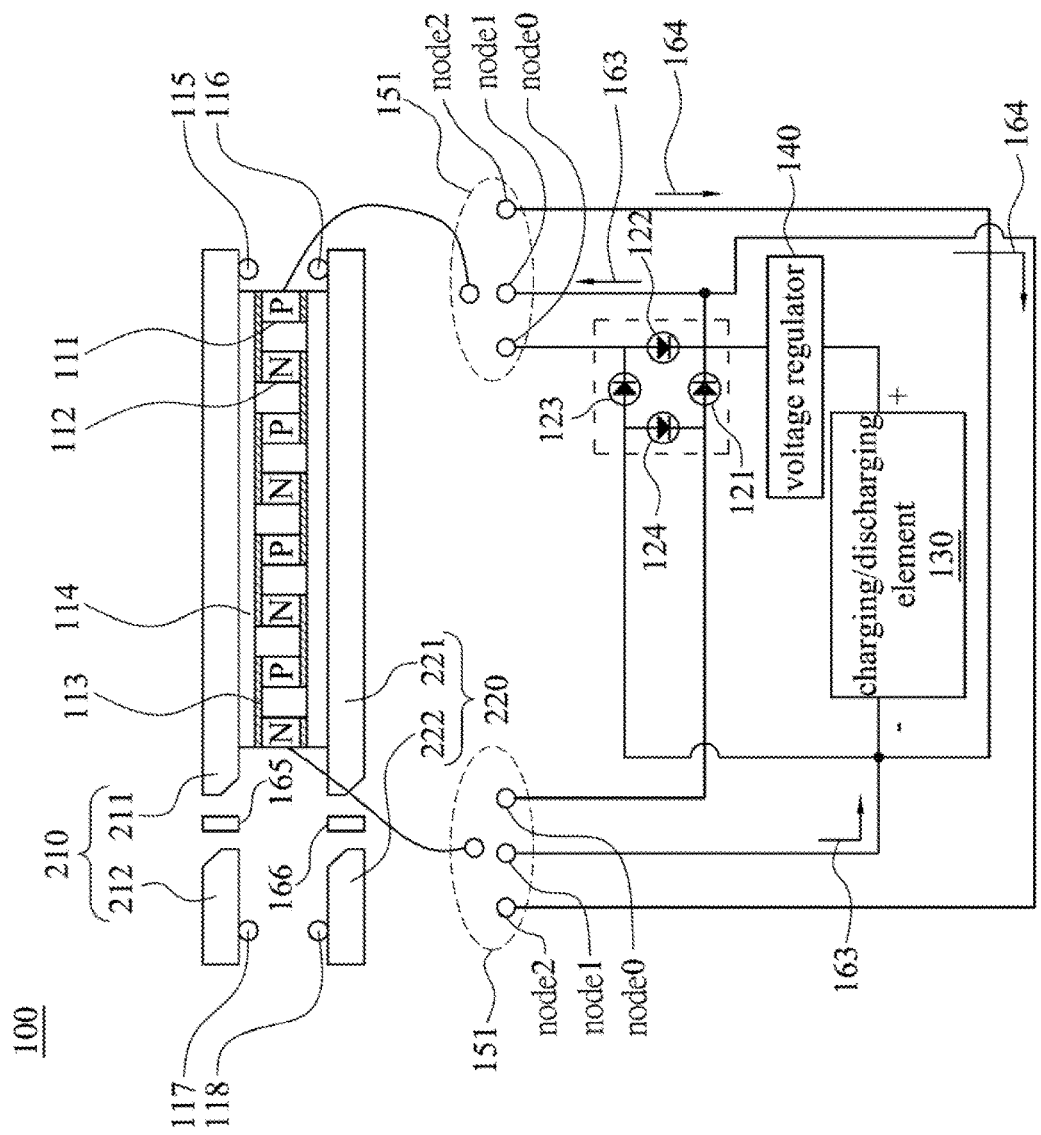
FIG. 4 illustrates a schematic diagram of a charging and discharging apparatus according to another preferred embodiment of the present invention.

FIG. 4 illustrates a schematic diagram of a charging and discharging apparatus according to another preferred embodiment of the present invention. Comparing with the previous embodiment, the main difference is that the upper cover 210 can be divided into at least two regions, a first upper cover portion 211 and a second upper cover portion 212, by the insulating material 165. Moreover, the lower cover 220 can be also divided into at least two regions, a first lower cover portion 221 and a second lower cover portion 222, by the insulating material 166. A step exists between the outside surface of the first upper cover portion 211 and that of the second upper cover portion 212. A step also exists between the outside surface of the first lower cover portion 221 and that of the second lower cover portion 222. In this embodiment, the thermoelectric conversion module 110 is disposed between the first upper cover portion 211 and the first lower cover portion 221. A first temperature sensor 115 and a second temperature sensor 116 are disposed on the sides of the P type thermal-electric material 111 of the first upper cover portion 211 and the first lower cover portion 221 respectively. In addition, a third temperature sensor 117 and a fourth temperature sensor 118 are also disposed on the second upper cover portion 212 and the second lower cover portion 222 respectively. Accordingly, even though the first upper cover portion 211 and the first lower cover portion 221 are affixed to a heat source or a cold source, the third temperature sensor 117 and the fourth temperature sensor 118 disposed on the second upper cover portion 212 and the second lower cover portion 222 still can correctly detect the ambient air temperature and the user's body temperature by the insulating material 165 and 166 to isolate the heat source or the cold source. In another embodiment, the third temperature sensor 117 and the fourth temperature sensor 118 can also be placed on the side cover, such as the as the strap of the wearable device illustrated in FIG. 2A and FIG. 2B.

Figure 5:
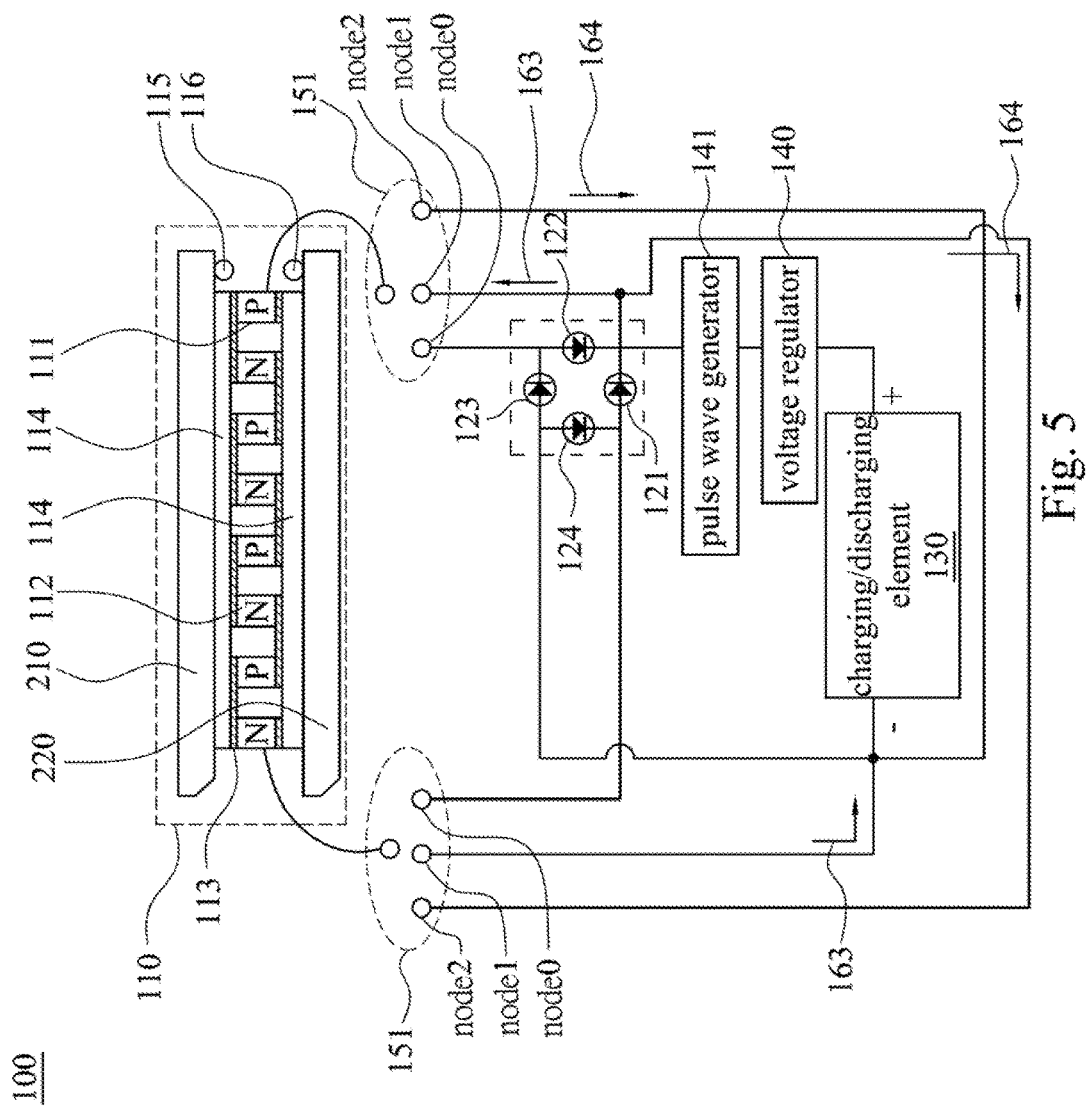
FIG. 5 illustrates a schematic diagram of a charging and discharging apparatus according to another preferred embodiment of the present invention.

FIG. 5 illustrates a schematic diagram of a charging and discharging apparatus according to another preferred embodiment of the present invention. Comparing with the previous embodiment, the main difference in this embodiment is that this circuit further includes a pulse wave generator 141. When the charging/discharging element 130 is a nickel-cadmium battery or a nickel-hydrogen battery, their inherent memory effect will detract the operation life. Therefore, a pulse wave generator 141 is used to transform the current from the thermoelectric conversion module 110 into a pulse current to charge the charging/discharging element 130 through the current path providing unit 120 to eliminate the battery memory effect and increase its operation life. Moreover, the pulse wave generator 141 also can transform a current from the charging/discharging element 130 into a pulse current to heat up or cool down the temperature of the upper cover 210 and the lower cover 220 through the third current path 163 or the fourth current path 164 to make human feel comfort. Such method may save power consumption.

Accordingly, the charging and discharging apparatus of the present invention generates a current by thermoelectric conversion method to charge the charging/discharging element in the wearable device. Therefore, it is not necessary to additionally set a connector on the outside surface of the wearable device. Moreover, in conjunction with a current path providing unit to provide different charging current paths, the thermoelectric conversion module may charge the charging and discharging element whether the user's body temperature is higher than the ambient air temperature or not. Therefore, the present invention may reach the purpose of making full use of the temperature difference.

Although the present invention has been described in considerable detail with reference to an embodiment thereof, other embodiments are possible. Therefore, the spirit and scope of the appended claims should not be limited to the description of the embodiment contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A charging/discharging apparatus, comprising:
    a thermoelectric conversion module disposed between an upper cover and a lower cover of a wearable device, the thermoelectric conversion module generating a current according to a temperature difference between the upper cover and the lower cover;
    a current path providing unit coupling with the thermoelectric conversion module for providing a first current path and a second current path;
    a charging/discharging element coupling with the current path providing unit;
    a third current path, wherein the charging/discharging element provides a first current to the thermoelectric conversion module through the third current path to heat up a temperature of the upper cover and cool down a temperature of the lower cover, wherein the first current flows through the thermoelectric conversion module according to a first direction;
    a fourth current path, wherein the charging/discharging element provides a second current to the thermoelectric conversion module through the fourth current path to heat up a temperature of the lower cover and cool down a temperature of the upper cover, wherein the second current flows through the thermoelectric conversion module according to a second direction, wherein the first direction is opposite to the second direction; and
    a switch disposed among the thermoelectric conversion module, the third current path, the forth current path and the current path providing unit, wherein the switch selects one of the third current path, the fourth current path and the current path providing unit to couple with the thermoelectric conversion module,
    wherein, when a temperature of the lower cover is higher than a temperature of the upper cover, the current charges the charging/discharging element through the first current path, and
    when a temperature of the upper cover is higher than a temperature of the lower cover, the current charges the charging/discharging element through the second current path.

2. The charging/discharging apparatus of claim 1, further comprising a voltage regulator disposed among the charging/discharging element, the third current path, the fourth current path and the current path providing unit.

3. The charging/discharging apparatus of claim 1, further comprising a pulse wave generator disposed among the charging/discharging element, the third current path, the fourth current path and the current path providing unit, wherein the pulse wave generator transforms a current from the thermoelectric conversion module into a pulse current to charge the charging/discharging element through the current path providing unit, or to transform a current from the charging/discharging element into a pulse current to heat up or cool down the temperature of the upper cover and the lower cover through the third current path and the fourth current path.

4. The charging/discharging apparatus of claim 1, wherein the thermoelectric conversion module comprises a plurality of P-type thermal-electric material and a plurality of N-type thermal-electric material coupled in series in a P-N pair formed.

5. The charging/discharging apparatus of claim 4, wherein the P-type thermal-electric material and the N-type thermal-electric material are formed of bismuth tellurium compounds or tellurium compounds.

6. The charging/discharging apparatus of claim 1, further comprising a first temperature sensor and a second temperature sensor disposed on the upper cover and the lower cover respectively, wherein the first temperature sensor and the second temperature sensor detect a temperature of the upper cover and a temperature of the lower cover, respectively.

7. The charging/discharging apparatus of claim 1, further comprising a first insulating material to divide the upper cover into a first upper cover portion and a second upper cover portion, and a second insulating material to divide the lower cover into a first lower cover portion and a second lower cover portion,
    wherein the thermoelectric conversion module is disposed between the first upper cover portion and the first lower cover portion, and a third temperature sensor and a fourth temperature sensor are disposed on the second upper cover portion and the second lower cover portion, respectively.

\* \* \* \* \*